United States Patent [19]

Mantopoulos et al.

[11] Patent Number: 5,061,904
[45] Date of Patent: Oct. 29, 1991

[54] PHASE LOCKED LOOP HAVING SAMPLING GATE PHASE DETECTOR

[75] Inventors: Thierry G. Mantopoulos; Fabrice M. Quinard, both of San Jose, Calif.

[73] Assignee: Radius Inc., San Jose, Calif.

[21] Appl. No.: 547,023

[22] Filed: Jun. 29, 1990

[51] Int. Cl.⁵ .......................................... H03L 7/091
[52] U.S. Cl. ..................................... 331/14; 331/17; 331/25
[58] Field of Search ..................... 331/1 A, 14, 17, 25, 331/26, 27, 28

[56] References Cited

U.S. PATENT DOCUMENTS 3,478,276 11/1969 Reichart ........................ 331/26 X
4,868,523 9/1989 Petersson ........................... 331/14

Primary Examiner—Siegfried H. Grimm
Attorney, Agent, or Firm—Stuart P. Meyer

[57] ABSTRACT

A phase-lock circuit for controlling an oscillator includes a sampling gate that operates during a gate interval to pass transitions in a comparison signal derived from the oscillator to produce therefrom an oscillator-controlling error signal that is representative of the phase-error direction and magnitude of the substantially symmetrical relationship between occurrence of transitions in the comparison signal within the interval of the gate pulse.

2 Claims, 5 Drawing Sheets

PHASE LOCKED LOOP HAVING SAMPLING GATE PHASE DETECTOR

RELATED APPLICATIONS

The subject matter of this application relates to the subject matter set forth in pending U.S. patent applications Ser. No. 07/547,060, entitled "Graphic Animation System and Method," filed on June 29, 1990 by Pierre-Alian Cotte, et al.; Ser. No. 07/546,916, entitled "Methods and Means for Manipulating Pixel Data," filed on June 29, 1990 by Pierre-Alain Cotte, et al.; Ser. No. 07/546,712, entitled "Memory Structure and Method for Managing Pixel Data," filed on June 29, 1990 by Pierre-Alain Cotte, et al.; Ser. No. 07/546,915, entitled "Method and Apparatus for Binary Value Modification by a Percentage," filed on June 29, 1990 by Thierry Mantopoulos; Ser. No. 07/547,026, entitled "Video Synchronization Generator and Method," filed on June 29, 1990 by Fabrice Quinard; Ser. No. 07/547,024, entitled "Bus Structure and Method for Compiling Pixel Data with Priorities," filed on June 29, 1990 by Thierry Mantopoulos and Fabrice Quinard; and Ser. No. 07/546,711, entitled "Video FIFO Buffer and Method," filed on June 29, 1990 by Fabrice Quinard, incorporated herein by reference.

FIELD AND BACKGROUND OF THE INVENTION

Many forms of electronic circuitry that include a local oscillator commonly require synchronization of the local oscillator with an associated input signal. For example, the oscillator associated with raster-type formation of the display in a conventional television receiver is typically synchronized with the received broadcast signal. The broadcast video signal includes synchronization information at the beginning of each horizontal video scan line of information needed to form a displayable image. In applications where the video synchronizing signal is relatively stable, as in video signals received from a broadcast studio, synchronization of a local oscillator is relatively easier than when synchronizing on video signals derived, for example, from a video cassette recorder (VCR).

SUMMARY OF THE INVENTION

In accordance with the present invention, a stabilizing circuit provides controlling signal to a local oscillator over a wide range of timing variations attributable to the incoming video signal. This is particularly important in applications involving precisely-clocked operations of a computer such as pixel counting that depend on the data in video signals derived from diverse sources. A sampling interval or window is controlled by the received video signal for comparison with a signal derived from the local oscillator, and the phase error between the sampled, compared signals produces a controlling voltage that then alters the operating frequency of the oscillator in a direction to correct the phase error over the interval to the next sampling interval.

DESCRIPTION OF THE PREFERRED EMBODIMENT

Figure 1:
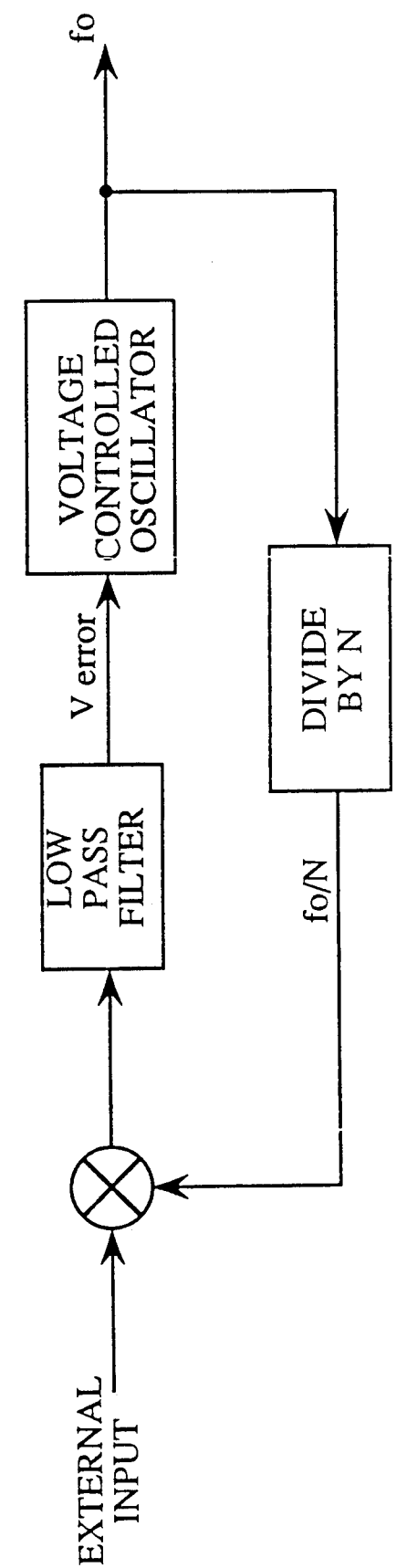
FIG. 1 is a block diagram of a phase-locked loop circuit of conventional design.
Figure 2:
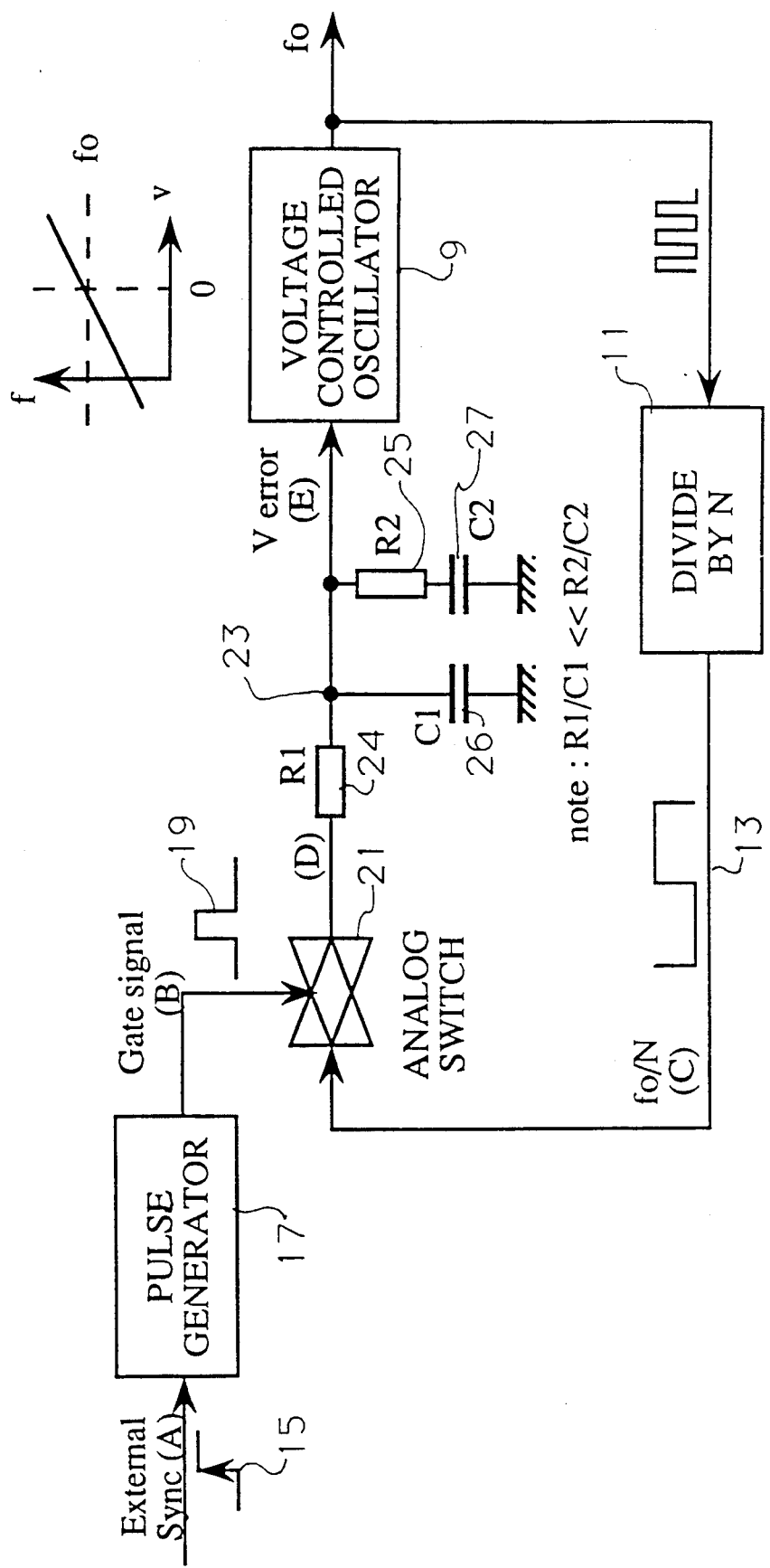
FIG. 2 is schematic diagram of the illustrated embodiment of the present invention.

Referring now to FIG. 2, there is shown a phase-lock loop circuit including a local oscillator for producing the output frequency, Fo, that controls, for example, the pixel counter at about 15 MHz rate of a computer-generated, raster-type display. This output frequency is divided by divide-by-N circuit 11 (where N may be 1000) to produce an output comparison signal 13 at about 15 kHz rate.

Figure 3:
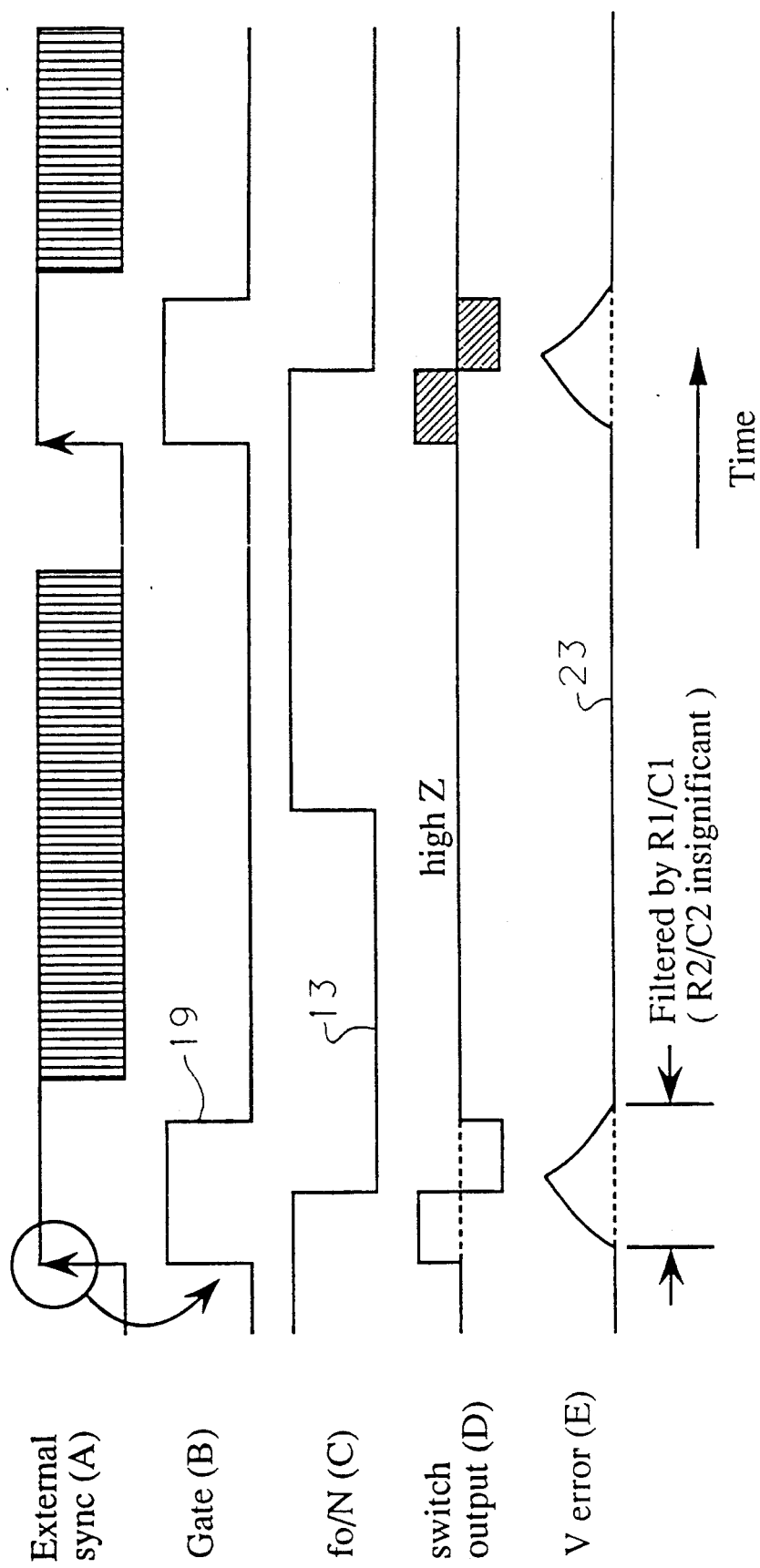
FIGS. 3-5 are graphs illustrating the timing signals present in the circuit of FIG. 2 during normal, slow and fast operation of the local oscillator.

An external synchronizing signal 15 that may be derived from the video signal received from a broadcast studio, or from a VCR, triggers pulse generator 17 to produce a gate pulse 19 of selected width that is applied to sampler, or analog switch 21. In normal operation at proper phase lock, a transition in the signal 13 between discrete states occurs approximately mid way through the interval of the gate signal 19, as illustrated in FIGS. 3(B) and 3(C). The transition in signal 13 in this manner yields an error signal, as illustrated in FIG. 3(E), that has positive integral of amplitude v. time that is equal to the negative integral of amplitude v. time, or zero error signal 23.

Figure 4:
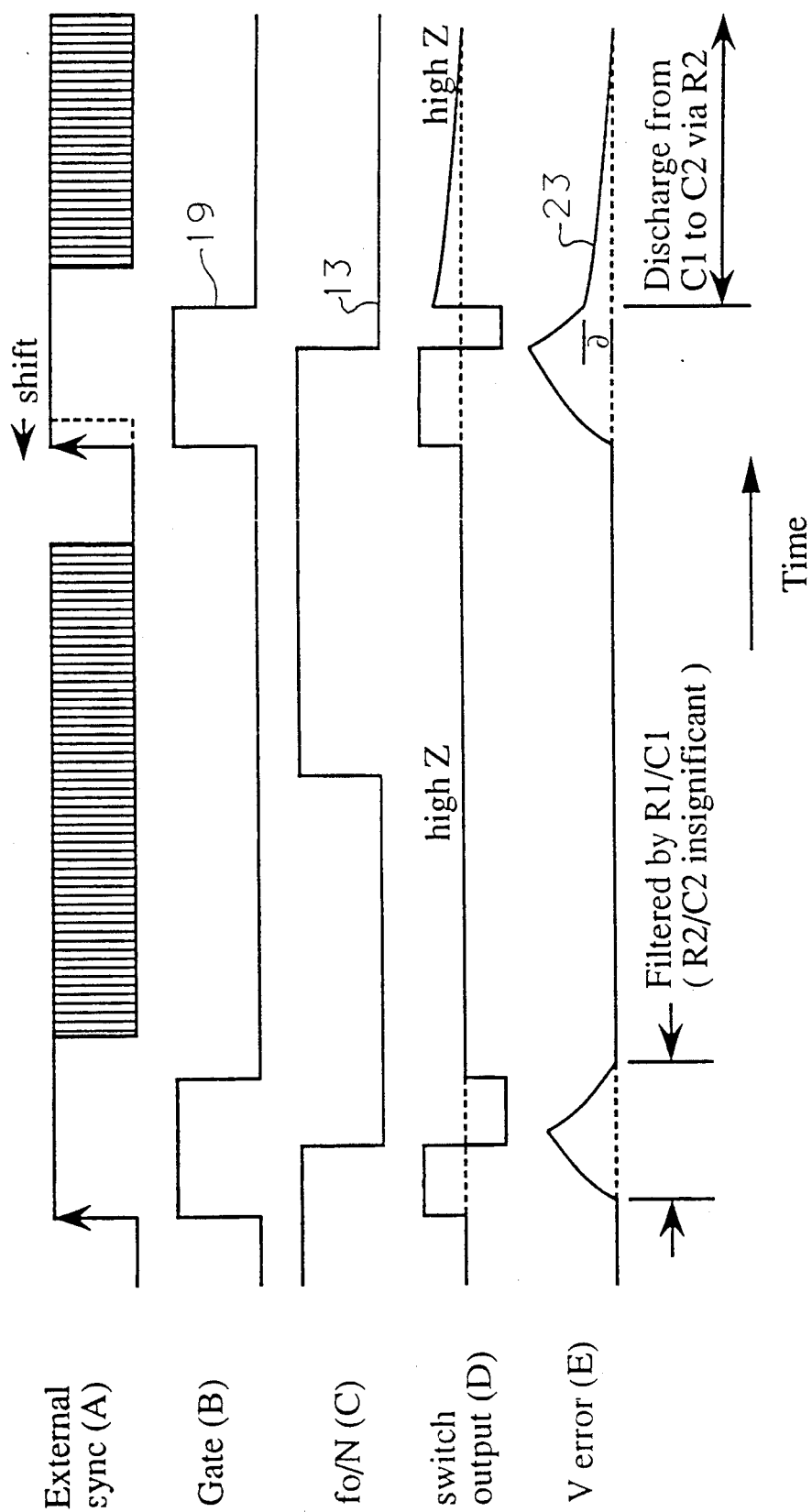
Figure 5:
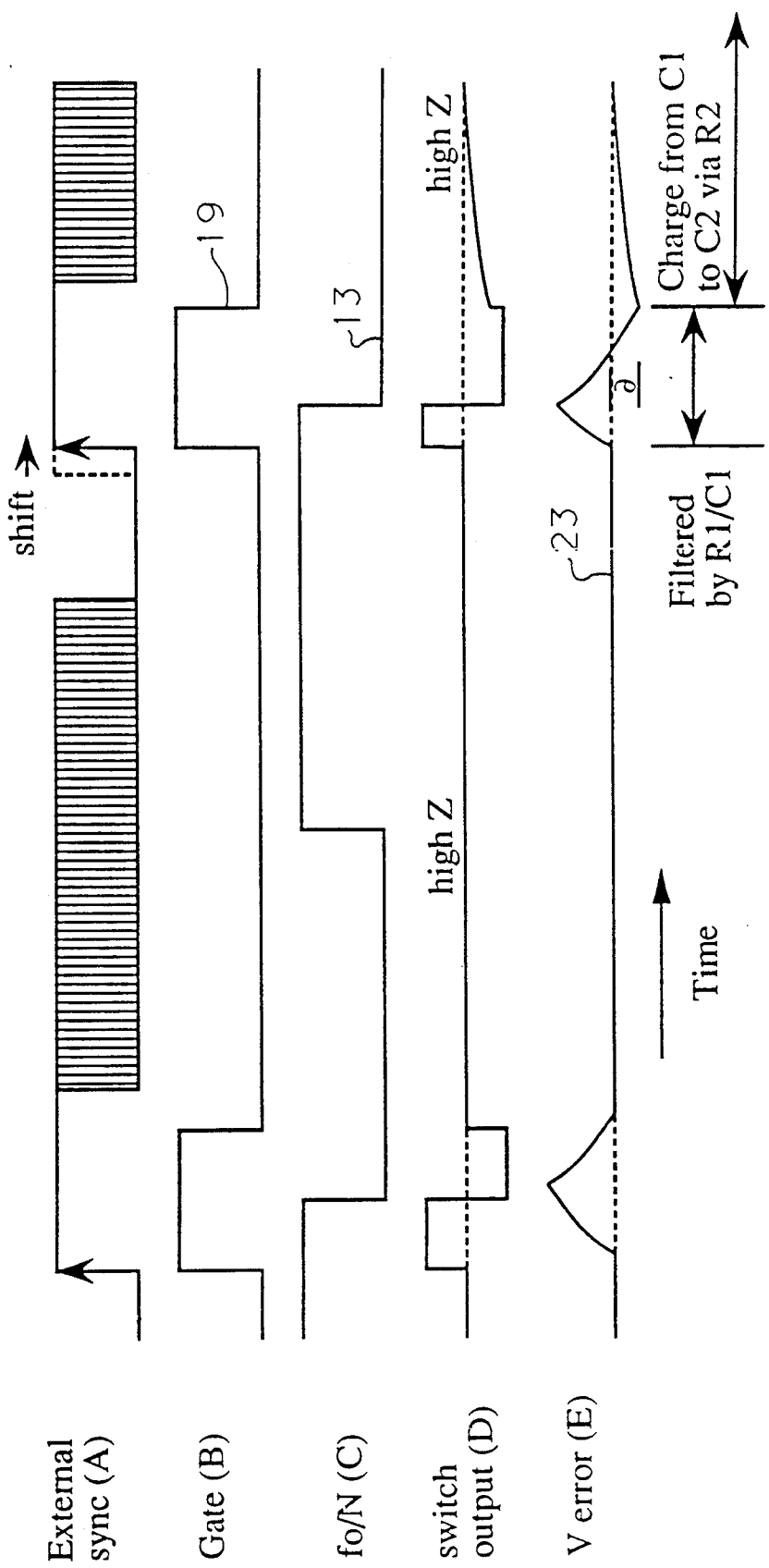

However, as illustrated in the graphs of FIGS. 4 and 5, if the external synchronizing pulse 15 shifts in time of occurrence relative to the transition in the comparison signal 13, then the transition in the latter signal is shifted within the interval of the gate pulse 19, yielding a net differential integral value of error signal 23 that is not zero. The integration and filtering of the sampled error is determined by the filter network of resistors 24,25 and capacitors 26,27 to provide a controlling voltage 23 to the oscillator 9, the frequency, Fo, of oscillator 9 is thus adjusted to speed up or slow down slightly in response to the error voltage 23, thereby to correct the phase relationship between the derived comparison signal 13 relative to the gate pulse 19 that is derived from the external synchronizing pulse 15. The components 24-27 of the filter are selected to assure that:

$$\frac{R_1}{C_1} < < \frac{R_2}{C_2} \qquad \text{(Eq. 1)}$$

and that charge will transfer substantially completely between $C_1$ and $C_2$ through $R_2$ well within the interval between consecutive gate pulses 19. In this way, the oscillator 9 is slightly advanced or retarded about its normal operating frequency, Fo, within the interval between gate pulses.

Therefore, stabilization of a phase locked loop is provided over a wide range of input signal timing variations.

What is claimed is:

1. A circuit for altering the phase of an oscillator signal relative to an applied signal, the circuit comprising:
   a divider for dividing the oscillator signal by a selected value to produce a comparison signal operating between first and second signal magnitudes;
   means responsive to the applied signal for producing a gate pulse;
   sampler means coupled to receive the gate pulse and the comparison signal for passing the comparison signal therethrough during the interval of the gate pulse;

filter means coupled to the sampler means for producing from the signal passed therethrough during the interval of a gate pulse an error signal of one polarity and magnitude representative of the early extent of occurrence of a transition in comparison signal between signal magnitudes relative to the interval of the gate pulse, and of opposite polarity and magnitude representative of the late extent of occurrence of a transition in comparison signal between signal magnitudes relative to the interval of the gate pulse; and means coupling the error signal to the oscillator for altering the frequency thereof in the direction and to a degree indicative of the polarity and magnitude of the error signal for restoring the transitions in the comparison signal substantially to occurrence symetrically within the interval of the gate pulse.

2. A circuit as in claim 1 wherein said filter means includes an integrator and energy-dissipative network for forming an error voltage relative to a reference value during the interval of a gate pulse that is diminished substantially to the reference value within the interval between recurrences of gate pulses.

* * * * *